United States Patent
Onozawa (10) Patent No.: US 9,954,053 B2
(45) Date of Patent: Apr. 24, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Yuichi Onozawa, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/252,562

(22) Filed: Aug. 31, 2016

(65) Prior Publication Data
US 2016/0372541 A1 Dec. 22, 2016

Related U.S. Application Data

(63) Continuation of application No. PCT/JP2015/072916, filed on Aug. 13, 2015.

(30) Foreign Application Priority Data

Sep. 17, 2014 (JP) ................... 2014-189475

(51) Int. Cl.
- *H01L 29/10* (2006.01)
- *H01L 29/06* (2006.01)
- *H01L 21/268* (2006.01)
- *H01L 21/263* (2006.01)
(Continued)

(52) U.S. Cl.
CPC ........ *H01L 29/0619* (2013.01); *H01L 21/263* (2013.01); *H01L 21/268* (2013.01);
(Continued)

(58) Field of Classification Search
CPC .......... H01L 29/0619; H01L 21/26513; H01L 29/7813; H01L 29/66712; H01L 29/7397;
(Continued)

(56) References Cited

U.S. PATENT DOCUMENTS

2006/0081923 A1* 4/2006 Mauder ................. H01L 21/263
                                                                    257/335
2008/0001257 A1   1/2008 Schulze et al.
(Continued)

FOREIGN PATENT DOCUMENTS

JP    S64-82563 A     3/1989
JP    2009-176892 A   8/2009
(Continued)

*Primary Examiner* — Jarrett Stark
(74) *Attorney, Agent, or Firm* — Rabin & Berdo, P.C.

(57) ABSTRACT

A method of manufacturing a semiconductor device, including implanting hydrogen atoms from a second principal surface of a semiconductor substrate, forming a plurality of second semiconductor layers that each have a carrier concentration higher than that of the first semiconductor layer and that have carrier concentration peak values at different depths from the second principal surface of the semiconductor substrate, applying a heat treatment process to promote generation of donors from the hydrogen atoms, implanting an impurity from the second principal surface of the semiconductor substrate, forming a third semiconductor layer in the semiconductor substrate at the second principal surface thereof, and applying another heat treatment process to locally heat the semiconductor substrate, so as to reduce the carrier concentration at an interface between the third semiconductor layer and the second semiconductor layer adjacent to the third semiconductor layer.

9 Claims, 5 Drawing Sheets

(51) Int. Cl.
  *H01L 21/324*  (2006.01)
  *H01L 29/36*  (2006.01)
  *H01L 29/66*  (2006.01)
  *H01L 29/739*  (2006.01)
  *H01L 21/265*  (2006.01)
  *H01L 29/78*  (2006.01)

(52) U.S. Cl.
  CPC ...... *H01L 21/26513* (2013.01); *H01L 21/324* (2013.01); *H01L 29/36* (2013.01); *H01L 29/66348* (2013.01); *H01L 29/66712* (2013.01); *H01L 29/7397* (2013.01); *H01L 29/7813* (2013.01); *H01L 29/1095* (2013.01)

(58) Field of Classification Search
  CPC . H01L 29/66348; H01L 29/36; H01L 21/324; H01L 21/263; H01L 21/268; H01L 29/1095
  See application file for complete search history.

(56) References Cited

U.S. PATENT DOCUMENTS

| | | |
|---|---|---|
| 2008/0054369 A1 | 3/2008 | Schulze et al. |
| 2009/0184340 A1 | 7/2009 | Nemoto et al. |
| 2010/0244093 A1 | 9/2010 | Rahimo et al. |
| 2012/0267681 A1 | 10/2012 | Nemoto et al. |
| 2014/0291723 A1 | 10/2014 | Miyazaki et al. |
| 2014/0374793 A1 | 12/2014 | Miyazaki et al. |
| 2015/0024556 A1 | 1/2015 | Miyazaki et al. |

FOREIGN PATENT DOCUMENTS

| | | |
|---|---|---|
| JP | 2010-541266 A | 12/2010 |
| JP | 2014-099643 A | 5/2014 |
| WO | WO-2013-108911 A1 | 7/2013 |
| WO | WO-2013-147274 A1 | 10/2013 |
| WO | WO-2013-147275 A1 | 10/2013 |

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/072916 filed on Aug. 13, 2015, which claims priority from Japanese Patent Application No. 2014-189475 filed on Sep. 17, 2014, the contents of which are incorporated herein by reference.

BACKGROUND OF THE INVENTION

1. Field of the Invention

The embodiments discussed herein relate to a semiconductor device and a method of manufacturing a semiconductor device.

2. Description of the Related Art

Insulated gate bipolar transistors (IGBTs) having a higher carrier concentration on a collector side of a drift layer than the drift layer and a field stop (FS) layer of the same conductivity type as the drift layer are conventionally known. The field stop layer has a function of suppressing the spread of the depletion layer from the emitter side to the collector side at turn-on and increasing the carriers remaining on the collector side. Further, disposal of the field stop layer enables control of the injection of carriers from the collector side to the drift layer and thereby, enables breakdown voltage to be maintained even when the thickness of the drift layer is reduced to lower the on-voltage.

As an IGBT having a field stop layer (hereinafter, FS-IGBT), a device including a field stop layer having a higher concentration peak than the carrier concentration of the drift layer and carrier concentration distribution in which the carrier concentration decreases from this concentration peak toward the collector side and the emitter side has been proposed (for example, refer to Japanese Laid-Open Patent Publication No. S64-082563 (lines 16 to 20 of lower right column of page 3, lines 5 to 11 of upper right column of page 4, and FIGS. 1, 2)). In Japanese Laid-Open Patent Publication No. S64-082563, the carrier concentration of the field stop layer is equal to the carrier concentration of the drift layer at the interface with the drift layer, and shows peaking from the drift layer interface toward the collector side and gradual decrease from the peak toward the collector layer.

As a method of forming a field stop layer having such carrier concentration distribution, a method of using the effect of proton donors to form a field stop layer is conventionally known. In this method, a layer of defects (vacancies (V)) is formed by proton irradiation, at a predetermined depth from a back surface of an $n^-$-type semiconductor substrate forming an $n^-$-type drift layer. Hydrogen (H) atoms irradiated on the defects and oxygen (O) atoms in the $n^-$-type semiconductor substrate bond, producing complex defects (Vacancy-Oxide-Hydrogen (VOH) defects). The VOH defects act as donors (hereinafter, hydrogen donors) supplying electrons, whereby the layer of VOH defects functions as an n-type field stop layer.

In the semiconductor device above, by heat treatment after the proton irradiation, VOH defect density is increased, enabling the hydrogen donor concentration (VOH defect concentration) to be increased. An activation process for increasing the hydrogen donor concentration may be implemented by low temperature annealing of 400 degrees C. or less. Therefore, for example, in producing (manufacturing) a thin-type diode or thin-type IGBT for which the product thickness has been reduced by grinding, processes after the thickness of the semiconductor wafer has been reduced may be significantly curtailed. Further, a broad (wide carrier concentration profile in a depth direction) n-type field stop layer formed by n-type layers respectively having carrier concentration peaks at differing depths may be formed by performing proton irradiation multiple times with differing accelerating voltages (for example, refer to US Patent Application No. 2008/0001257).

Further, as a method of forming an n-type field stop layer by proton irradiation, a method of irradiating protons from a back surface of a semiconductor wafer, simultaneously irradiating two types of lasers of differing wavelengths, and forming an n-type field stop layer using the effect of proton donors; and thereafter, forming a $p^+$-type collector layer in a region through which protons pass (hereinafter, proton transmission region) on a back surface side of the semiconductor wafer has been proposed (for example, refer to Japanese Laid-Open Patent Publication No. 2009-176892). In the technique described in Japanese Laid-Open Patent Publication No. 2009-176892, the carrier concentration of a portion (tail portion) of the n-type field stop layer near a pn junction with a $p^+$-type collector layer is higher than the carrier concentration of the $n^-$-type drift layer.

SUMMARY OF THE INVENTION

According to one aspect of the present invention a method of manufacturing a semiconductor device including a front surface device structure formed on a first principal surface side of a first semiconductor layer of a first conductivity type; a second semiconductor layer of the first conductivity type, having a higher carrier concentration than that of the first semiconductor layer, and formed in a surface layer of a second principal surface of the first semiconductor layer; a third semiconductor layer of the second conductivity type, formed in the surface layer of the second principal surface of the first semiconductor layer, at a position shallower than the second semiconductor layer, includes a first implantation process of implanting hydrogen atoms from a second principal surface side of a semiconductor substrate of the first conductivity type, the semiconductor substrate forming the first semiconductor layer, and forming in the surface layer of the second principal surface of the semiconductor substrate, a plurality of the second semiconductor layers of the first conductivity type, having a peak of carrier concentration at mutually differing depths from the second principal surface of the semiconductor substrate; a first heat treatment process of promoting generation of donors from the hydrogen atoms by a first heat treatment; a second implantation process of implanting an impurity of the second conductivity type, from the second principal surface side of the semiconductor substrate after the first heat treatment process, and forming the third semiconductor layer of the second conductivity type in the surface layer of the second principal surface of the semiconductor substrate, at a position shallower than the second semiconductor layer; and a second heat treatment process of locally heating the semiconductor substrate by a second heat treatment so as to activate the third semiconductor layer and reduce a carrier concentration at an interface of the third semiconductor layer and the second semiconductor layer formed farthest on a third semiconductor layer side. The second heat treatment process includes reducing the carrier concentration at the interface such that a concentration ratio with respect to a peak value of a carrier concentration of the third semiconductor layer becomes a predetermined value or greater with respect to the carrier concentration at the interface of the third semiconductor layer and the second semiconductor layer formed farthest on the third semiconductor layer side.

In the method of manufacturing a semiconductor device, the second heat treatment process includes heating the second principal surface side of the semiconductor substrate so that the hydrogen atoms disappear and the carrier concentration at the interface of the third semiconductor layer and the second semiconductor layer formed farthest on the third semiconductor layer side decreases.

In the method of manufacturing a semiconductor device, the second heat treatment process includes decreasing a carrier concentration of a portion, on the third semiconductor layer side, of the second semiconductor layer formed farthest on the third semiconductor layer side, to be lower than at a position of the peak of the carrier concentration.

In the method of manufacturing a semiconductor device, the first heat treatment process includes forming the plurality of the second semiconductor layers to have a carrier concentration distribution that decreases from the position of the peak toward the third semiconductor layer and such that the carrier concentration distribution of a second portion on the third semiconductor layer side from a predetermined position has a slope that is smaller than a slope of the carrier concentration distribution of a first portion from the position of the peak to the predetermined position on the third semiconductor layer side, and the second heat treatment process includes decreasing the carrier concentration of the second portion of the second semiconductor layer formed farthest on the third semiconductor layer side.

In the method of manufacturing a semiconductor device, the second heat treatment process includes increasing the slope of the carrier concentration distribution of the second portion of the second semiconductor layer formed farthest on the third semiconductor layer side, to be greater than before the second heat treatment.

In the method of manufacturing a semiconductor device, the second heat treatment process includes decreasing the carrier concentration at the interface of the third semiconductor layer and the second semiconductor layer formed farthest on the third semiconductor layer side, to be at most a carrier concentration at an interface with another of the second semiconductor layers, adjacent to the second semiconductor layer.

In the method of manufacturing a semiconductor device, the second heat treatment process includes decreasing the carrier concentration such that the concentration ratio with respect to the peak value of the carrier concentration of the third semiconductor layer becomes at least five times the carrier concentration at the interface of the third semiconductor layer and the second semiconductor layer formed farthest on the third semiconductor layer side.

In the method of manufacturing a semiconductor device, the second implantation process includes forming the third semiconductor layer to have the peak value of the carrier concentration to be at least a peak value of the carrier concentration of the second semiconductor layer formed farthest on the third semiconductor layer side.

In the method of manufacturing a semiconductor device, the second heat treatment process includes decreasing the carrier concentration at the interface of the third semiconductor layer and the second semiconductor layer formed farthest on the third semiconductor layer side to be about the carrier concentration of the first semiconductor layer.

According to another aspect of the present invention, a semiconductor device includes a front surface device structure formed on a first principal surface side of a first semiconductor layer of a first conductivity type; a plurality of second semiconductor layers of the first conductivity type, formed in a surface layer of a second principal surface of the first semiconductor layer, having a carrier concentration higher than that of the first semiconductor layer, and a peak of carrier concentration at mutually differing depths from the second principal surface of the first semiconductor layer; and a third semiconductor layer of a second conductivity type formed in the surface layer of the second principal surface of the first semiconductor layer, at a position shallower than the second semiconductor layer. The plurality of second semiconductor layers has a carrier concentration distribution that decreases from a position of the peak toward the third semiconductor layer. The plurality of second semiconductor layers excluding the second semiconductor layer formed farthest on a third semiconductor layer side (hereinafter, "first second-semiconductor-layer") has on the third semiconductor layer side, a second portion from a predetermined position, for which a slope of the carrier concentration distribution is less than a slope of the carrier concentration distribution for a first portion from the position of the peak to the predetermined position on the third semiconductor layer side. A carrier concentration at an interface of the first second-semiconductor-layer and the third semiconductor layer is at most a carrier concentration at an interface of the first second-semiconductor-layer and another of the second semiconductor layers adjacent to the first second-semiconductor-layer.

In the semiconductor device, the carrier concentration at the interface of the first second-semiconductor-layer and the third semiconductor layer is at most a carrier concentration of an interface of the first second-semiconductor-layer and the second semiconductor layer adjacent to the first second-semiconductor-layer, among the plurality of second semiconductor layers formed farther on the first semiconductor side than the first second-semiconductor-layer.

In the semiconductor device, the carrier concentration at the interface of the first second-semiconductor-layer and the third semiconductor layer is less than a carrier concentration at an interface of the second semiconductor layer formed farthest on the first semiconductor layer side (hereinafter, "second second-semiconductor-layer") among the plurality of second semiconductor layers formed farther on the first semiconductor side than the first second-semiconductor-layer and the second semiconductor layer adjacent to the second second-semiconductor-layer.

According to yet another aspect of the present invention, a semiconductor device includes a front surface device structure formed on a first principal surface side of a first semiconductor layer of a first conductivity type; a plurality of second semiconductor layers of the first conductivity type, formed in a surface layer of a second principal surface of the first semiconductor layer, having a carrier concentration higher than that of the first semiconductor layer, and a peak of carrier concentration at mutually differing depths from the second principal surface of the first semiconductor layer; and a third semiconductor layer of a second conductivity type formed in the surface layer of the second principal surface of the first semiconductor layer, at a position shallower than the second semiconductor layer. The plurality of second semiconductor layers has a carrier concentration distribution that decreases from a position of the peak toward the third semiconductor layer. The plurality of second semiconductor layers excluding the second semiconductor layer formed farthest on a third semiconductor layer side (hereinafter, "first second-semiconductor-layer") has on the third semiconductor layer side, a second portion from a predetermined position, for which a slope of the carrier concentration distribution is less than a slope of the carrier concentration distribution for a first portion from the position of the peak to the predetermined position on the third semiconductor layer side. A carrier concentration at an interface of the first second-semiconductor-layer and the third semiconductor layer is at least the carrier concentration of the first semiconductor layer.

In the semiconductor device, the peak value of the carrier concentration of the third semiconductor layer is at least five times the carrier concentration at the interface of the first second-semiconductor-layer and the third semiconductor layer.

In the semiconductor device, the front surface device structure is configured by: a first semiconductor region of the second conductivity type, formed in the surface layer of the first principal surface of the first semiconductor layer; a second semiconductor region of the first semiconductor type, formed in the first semiconductor region; a gate insulating film formed so as to contact a region of the first semiconductor region, between the first semiconductor layer and the second semiconductor region; and a gate electrode formed on an opposite side of the first semiconductor region, sandwich the gate insulating film. The semiconductor device further includes a first electrode contacting the first semiconductor region and the second semiconductor region; and a second electrode contacting the second principal surface of the first semiconductor layer.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

Figure 1:
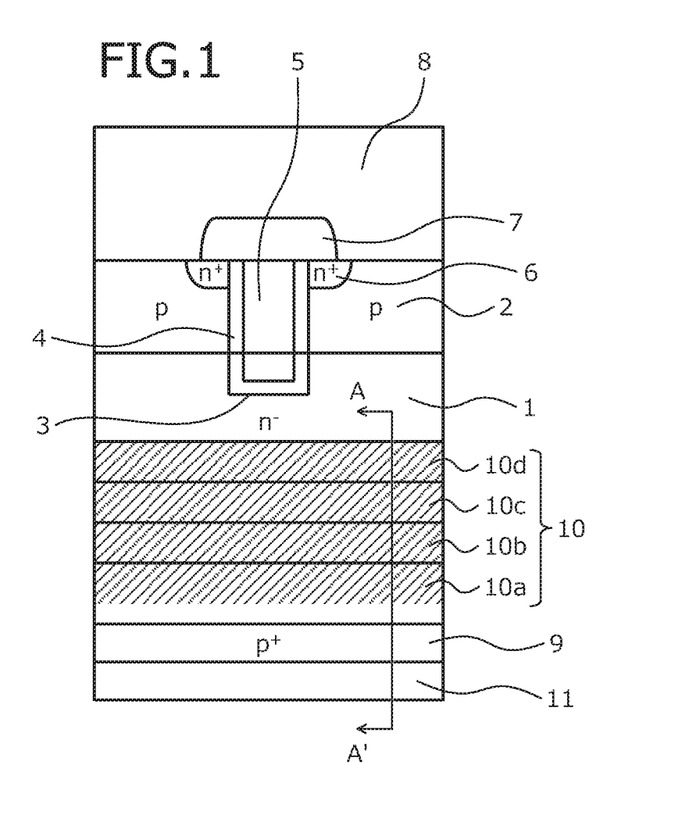
FIG. 1 is a cross-sectional view of a structure of a semiconductor device according to an embodiment.

A structure of a semiconductor device according to an embodiment will be described. FIG. 1 is a cross-sectional view of the structure of the semiconductor device according to the embodiment. In FIG. 1, a single unit cell (functional unit of a device) of an active region (region in which current flows during the ON state) responsible for current driving is depicted and other unit cells repeatedly disposed so as to be adjacent to this unit cell and an edge termination structure surrounding a periphery of the active region is not depicted. The edge termination structure is a region that mitigates the electric field of a substrate front surface side of an n⁻-type drift layer 1, maintains the breakdown voltage, and has, for example, a termination structure combining guard rings, field plates, and RESURF.

The semiconductor device depicted in FIG. 1 is an FS-IGBT including an n-type field stop layer 10 that is formed on a collector side of the n⁻-type drift layer 1 and has a carrier concentration that is higher than that of the n⁻-type drift layer 1. In the present embodiment, a first semiconductor layer of a first conductivity type according to the present invention is implemented by the n⁻-type drift layer 1, and a second semiconductor layer of the first conductivity type according to the present invention is implemented by the n-type field stop layer 10. Further, in the present embodiment, a second principal surface is implemented by the collector side of the n⁻-type drift layer 1.

In particular, a MOS gate structure formed by a p-type base region 2, a trench 3, a gate insulating film 4, a gate electrode 5, and an n⁺-type emitter region 6 is disposed on a front surface side (first principal surface side) of an n⁻-type semiconductor substrate (semiconductor chip) forming the n⁻-type drift layer 1. In the present embodiment, a front surface device structure according to the present invention is implemented by the MOS gate structure.

The p-type base region 2 is disposed in a surface layer of a front surface of the n⁻-type semiconductor substrate. The trench 3 penetrates the p-type base region 2 in a depth direction, reaching the n⁻-type drift layer 1. Inside the trench 3, the gate insulating film 4 is disposed along an inner wall of the trench 3, and the gate electrode 5 is disposed on the gate insulating film 4.

The n⁺-type emitter region 6 is selectively disposed in the p-type base region 2 so as to face the gate electrode 5, across the gate insulating film 4 disposed on a side wall of the trench 3. A p⁺-type contact region (not depicted) may be selectively disposed in the p-type base region 2 so as to contact the n⁺-type emitter region 6. An emitter electrode 8 contacts the p-type base region 2 (or, p⁺-type contact region) and the n⁺-type emitter region 6, and is electrically isolated from the gate electrode 5 by an interlayer insulating film 7.

A p⁺-type collector layer 9 is disposed in a surface layer of a back surface of the n⁻-type semiconductor substrate. In the present embodiment, a third semiconductor layer of a second conductivity type according to the present invention is implemented by the p⁺-type collector layer 9. The n-type field stop layer 10 is disposed at a position deeper than the p⁺-type collector layer 9, from the substrate back surface. The p⁺-type collector layer 9 is disposed in a region (hereinafter, hydrogen transmission region) through which hydrogen atoms pass during ion implantation of hydrogen (H) (hereinafter, hydrogen ion implantation) for forming the n-type field stop layer 10 described hereinafter.

A collector electrode 11 contacts the p⁺-type collector layer 9. The n-type field stop layer 1 is formed by multiple n-type layers for which the carrier concentration respectively peaks (hereinafter, carrier peak concentration) at differing depths from the back surface of the n⁻-type semiconductor substrate. In FIG. 1, the n-type field stop layer 10 formed by four n-type layers is depicted. The n-type field stop layer 10 has a broad (wide in the depth direction) carrier concentration profile.

Here, a case where the n-type field stop layer 10 is formed by four n-type layers (hereinafter, first to fourth n-type layers) 10a to 10d having carrier peak concentrations at differing depths from the back surface of the n$^-$-type semiconductor substrate will be described as an example. The first n-type layer 10a is disposed farthest on the collector side and contacts the p$^+$-type collector layer 9. The second n-type layer 10b is disposed farther on an emitter side than the first n-type layer 10a and contacts the first n-type layer 10a. The third n-type layer 10c is disposed farther on the emitter side than the second n-type layer 10b and contacts the second n-type layer 10b. The fourth n-type layer 10d is disposed farther on the emitter side than the third n-type layer 10c and contacts the third n-type layer 10c.

A tail portion described hereinafter is not disposed in the first n-type layer 10a. The carrier concentration of the first n-type layer 10a at the p$^+$-type collector layer 9 interface is lower than when the tail portion is disposed. In FIG. 1, a state where the carrier concentration on the p$^+$-type collector layer 9 side where the tail portion is not disposed in the first n-type layer 10a is low is indicated without hashing marks near the p$^+$-type collector layer 9 interface of the first n-type layer 10a. On the other hand, the tail portion is disposed in the second to fourth n-type layers 10b to 10d, respectively. The tail portions of the second to fourth n-type layers 10b to 10d respectively contact the first to third n-type layers 10a to 10c on the collector side. Thicknesses of the first to fourth n-type layers 10a to 10d may differ respectively, or may be the same.

Figure 2:
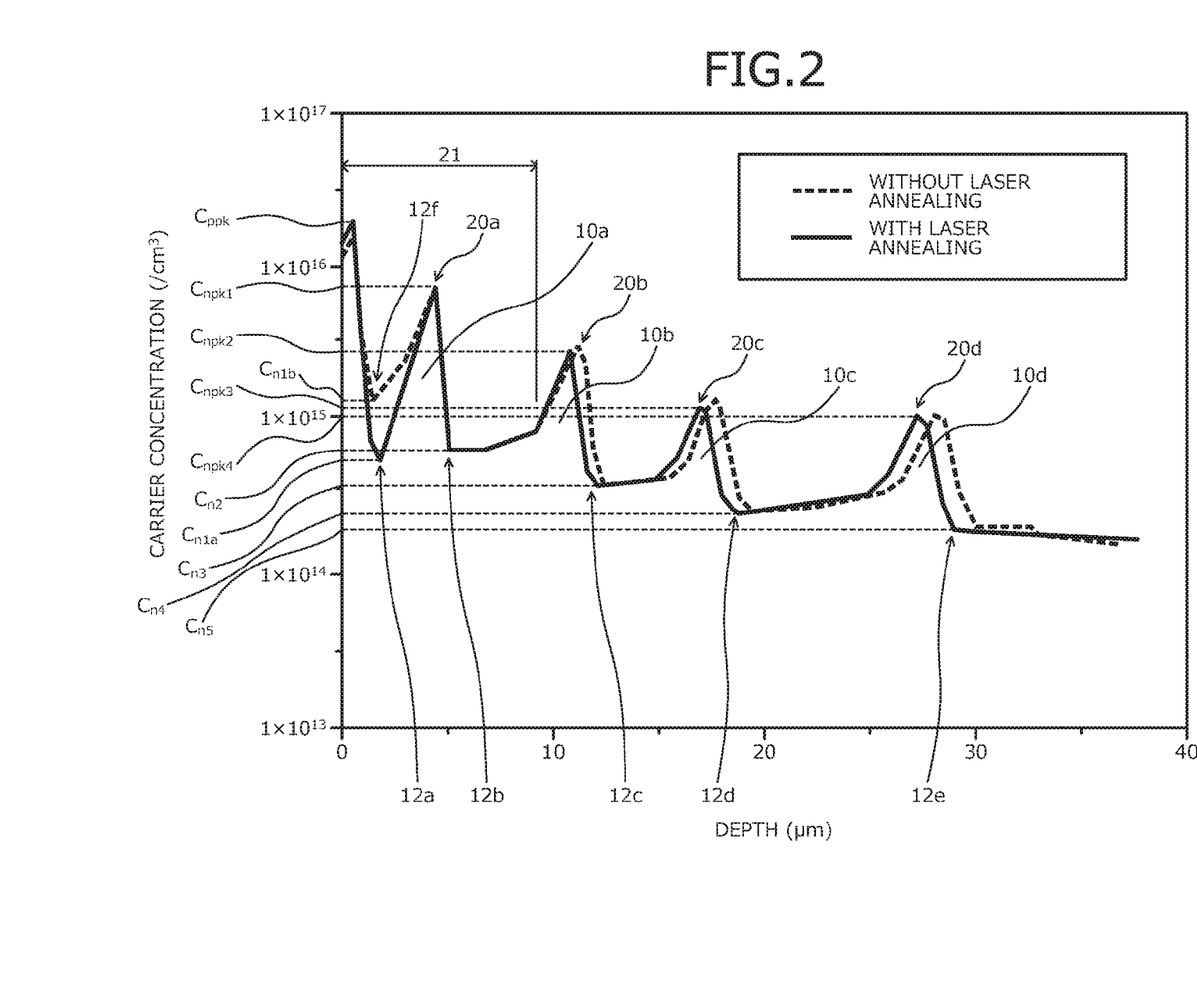
FIG. 2 is a characteristic diagram of carrier concentration distribution at cutting line A-A' in FIG. 1.
Figure 3:
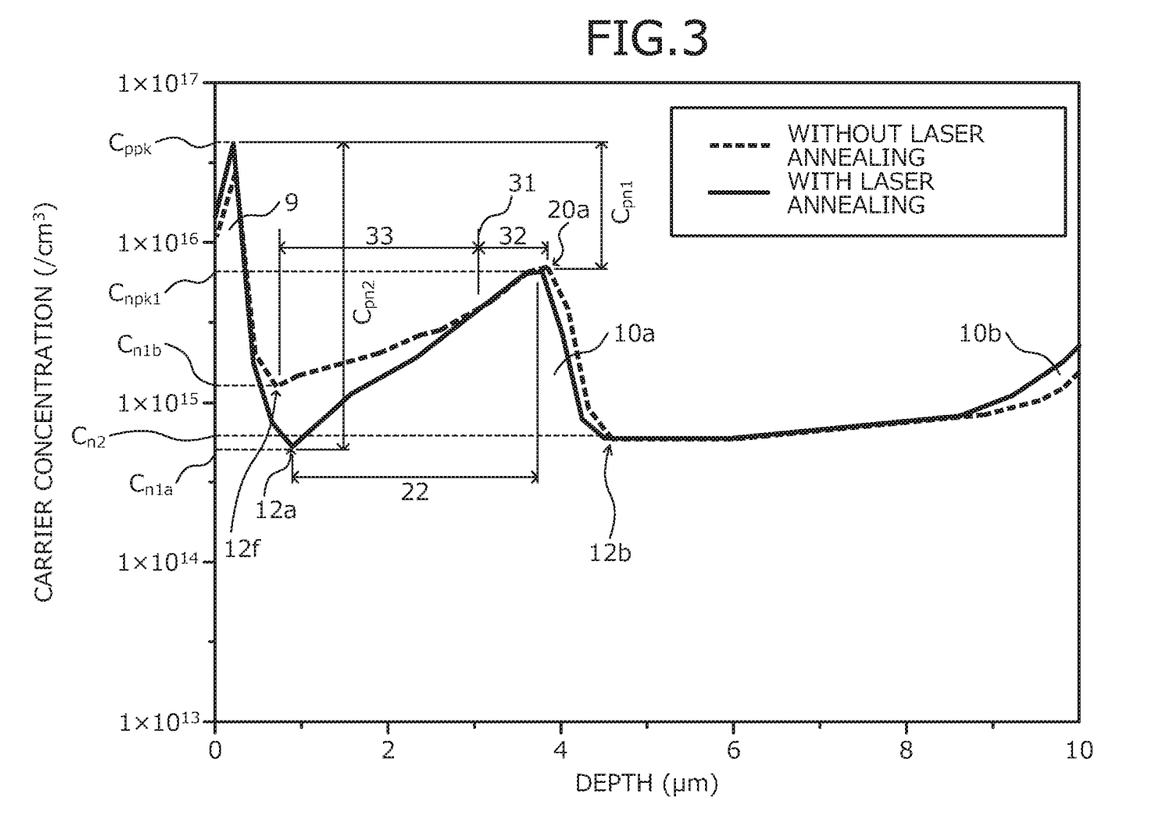
FIG. 3 is an enlarged characteristic diagram of a carrier concentration distribution on a collector side of FIG. 2.
Figure 4:
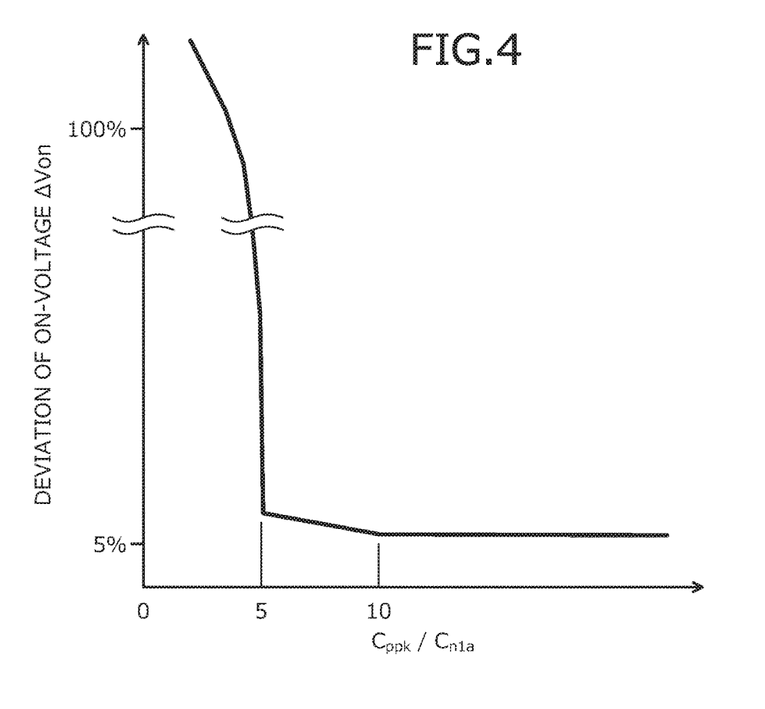
FIG. 4 is a characteristic diagram of on-voltage deviation of the semiconductor device according to the embodiment.

The carrier concentration distribution of the n-type field stop layer 10 (first to fourth n-type layers 10a to 10d) will be described with reference to FIGS. 2 to 4. FIG. 2 is a characteristic diagram of carrier concentration distribution at cutting line A-A' in FIG. 1. FIG. 3 is an enlarged characteristic diagram of the carrier concentration distribution on the collector side of FIG. 2. FIG. 4 is a characteristic diagram of on-voltage deviation of the semiconductor device according to the embodiment. FIG. 3 depicts the carrier concentration distribution of FIG. 2 at depths (portion indicated by arrow 21) from the substrate back surface (junction interface of the p$^+$-type collector layer 9 and the collector electrode 11) to a vicinity of the tail portion of the second n-type layer 10b.

The carrier concentration distribution before and after laser annealing (without laser annealing, with laser annealing) in the method of manufacturing a semiconductor device according to the present embodiment and described hereinafter is depicted in FIGS. 2 and 3. "Without laser annealing" is a state before the laser annealing and is the carrier concentration distribution of the n-type field stop layer 10 during manufacture. "With laser annealing" is a state after the laser annealing and is the carrier concentration distribution of the n-type field stop layer 10 at device (product) completion. Hereinafter, the carrier concentration distribution of the n-type field stop layer 10 at product completion will be described.

As depicted in FIGS. 2 and 3, the first to fourth n-type layers 10a to 10d of the n-type field stop layer 10 respectively have carrier peak concentrations $C_{npk1}$ to $C_{npk4}$ at differing depths from the back surface of the n$^-$-type semiconductor substrate, and have carrier concentration distribution showing decrease from depth position where the carrier peak concentration $C_{npk1}$ to $C_{npk4}$ occurs (hereinafter, peak position) 20a to 20d toward the collector side and the emitter side. The carrier peak concentrations $C_{npk1}$ to $C_{npk4}$ increase ($C_{npk1}$>$C_{npk2}$>$C_{npk3}$>$C_{npk4}$) corresponding to the proximity of the first to fourth n-type layers 10a to 10d to the collector side. In other words, the carrier peak concentration $C_{npk1}$ of the first n-type layer 10a disposed farthest on the collector side is highest among the carrier peak concentrations $C_{npk1}$ to $C_{npk4}$ of the first to fourth n-type layers 10a to 10d.

The carrier peak concentration $C_{npk1}$ of the first n-type layer 10a, for example, is the carrier peak concentration $C_{ppk}$ of the p$^+$-type collector layer 9 or less ($C_{ppk}/C_{npk1} \geq 1$). If the carrier peak concentration $C_{ppk}$ of the p$^+$-type collector layer 9 is less than the carrier peak concentration $C_{npk1}$ of the first n-type layer 10, the ohmic contact with the collector electrode 11 may be established, however, hole injection efficiency becomes too low and the device may not operate as an IGBT.

The injection efficiency of holes from the collector side is suppressed by properly setting a concentration ratio $C_{pn1}$ of the carrier peak concentration $C_{ppk}$ of the p$^+$-type collector layer 9 to the carrier peak concentration $C_{npk1}$ of the first n-type layer 10a. In particular, for example, high speed switching may be achieved by lowering the carrier peak concentration $C_{ppk}$ of the p$^+$-type collector layer 9 to reduce the concentration ratio $C_{pn1}$ of the carrier peak concentration $C_{ppk}$ of the p$^+$-type collector layer 9 to the carrier peak concentration $C_{npk1}$ of the first n-type layer 10a.

The carrier peak concentration $C_{npk1}$ of the first n-type layer 10a may be about 10 times the carrier concentration $C_{n1a}$ of an interface 12a of the first n-type layer 10a and the p$^+$-type collector layer 910 or greater ($C_{npk1}/C_{n1a} \geq 10$) to thereby enable the switching speed to be increased further. The interface 12a of the first n-type layer 10a and the p$^+$-type collector layer 9 is a depth position where a carrier concentration (donor concentration) $C_{n1a}$ of the first n-type layer 10a and a carrier concentration (acceptor concentration) of the p$^+$-type collector layer 9 are substantially the same.

With consideration of reducing the thickness of the n$^-$-type semiconductor substrate to reduce the device size, a depth of a peak position 20a of the first n-type layer 10a, from the substrate back surface may be as far as possible from the interface 12a of the first n-type layer 10a and the p$^+$-type collector layer 9 to thereby enable deviation of the on-voltage ΔVon to be reduced.

The tail portion is disposed in each of the second to fourth n-type layers 10b to 10d. The tail portions of the second to fourth n-type layers 10b to 10d contact the first to third n-type layers 10a to 10c on the collector side, respectively. The tail portion is a portion of an n-type layer where the carrier concentration decreases along a gradual slope (like a flared a hem) toward the collector side, from an inflection point (point of change of the concentration slope) on the collector side, a predetermined distance from the peak position.

In particular, the tail portion is a portion of an n-type layer from the inflection point (=shallow position corresponding to the standard deviation σ on the collector side, from the peak position) of the carrier concentration distribution where decrease follows a Gaussian distribution curve from the peak position toward the collector side, to an adjacent n-type layer on the collector side. The slope of the carrier concentration distribution of the tail portion decreases more gradually on the collector side than the slope of the carrier concentration distribution from the peak position to the inflection point (between the peak position and tail portion).

The carrier concentration $C_{n2}$ at an interface 12b of the first n-type layer 10a and tail portion of the second n-type layer 10b is lower than the carrier peak concentration $C_{npk1}$ of the first n-type layer 10a and higher than the carrier concentration $C_{n3}$ of an interface 12c of the second n-type layer 10b and the tail portion of the third n-type layer 10c. The carrier concentration $C_{n3}$ of the interface 12c of the second n-type layer 10b and the tail portion of the third n-type layer 10c is higher than the carrier concentration $C_{n4}$ of an interface 12d of the third n-type layer 10c and the tail portion of the fourth n-type layer 10d. The carrier concentration $C_{n4}$ of the interface 12d of the third n-type layer 10c and the tail portion of the fourth n-type layer 10d is higher than the carrier concentration (i.e., carrier concentration $C_{n5}$ of the n⁻-type drift layer 1) of an interface 12e of the fourth n-type layer 10d and the n⁻-type drift layer 1 ($C_{npk1} > C_{n2} > C_{n3} > C_{n4} > C_{n5}$).

The tail portion is not disposed in the first n-type layer 10a. In other words, the carrier concentration distribution of the first n-type layer 10a, at a portion 22 thereof on the collector side from the peak position 20a decreases from the peak position 20a toward the collector side and the decrease has a substantially constant slope. The portion 22 of the first n-type layer 10a on the collector side from the peak position 20a is a portion of the first n-type layer 10a, from the peak position 20a to the interface 12a with the p⁺-type collector layer 9. The slope of the carrier concentration distribution of the first n-type layer 10a, at the portion 22 on the collector side from the peak position 20a is greater than the slopes of the tail portions of the second to fourth n-type layers 10b to 10d.

Further, the slope of the carrier concentration distribution of the first n-type layer 10a, at the portion 22 on the collector side from the peak position 20a is greater than the slope of the carrier concentration distribution of a tail portion 33 of the first n-type layer 10a in a state without laser annealing. In the state without laser annealing, the tail portion 33 of the first n-type layer 10a is a portion of the first n-type layer 10a, from an inflection point 31 a predetermined distance from the peak position 20a on the collector side, to the interface 12f with the p⁺-type collector layer 9. In the state without laser annealing, the carrier concentration $C_{n1a}$ at the interface 12a of the first n-type layer 10a and the p⁺-type collector layer 9 is lower than the carrier concentration $C_{n1b}$ at an interface 12f of the p⁺-type collector layer 9 and the tail portion 33 of the first n-type layer 10a ($C_{n1a} < C_{n1b}$).

Further, the carrier concentration $C_{n1a}$ at the interface 12a of the first n-type layer 10a and the p⁺-type collector layer 9 may be about equal to or less than the carrier concentration $C_{n2}$ at the interface 12b of the first n-type layer 10a and the tail portion of the second n-type layer 10b ($C_{n1a} \leq C_{n2}$) to thereby enable the concentration ratio $C_{pn2}$ ($=C_{ppk}/C_{n1a}$) of the carrier peak concentration $C_{ppk}$ of the p⁺-type collector layer 9 to the carrier concentration $C_{n1a}$ at the interface of the first n-type layer 10a and the p⁺-type collector layer 9 to be increased.

As a result, even when the carrier peak concentration $C_{ppk}$ of the p⁺-type collector layer 9 is reduced to increase the switching speed, deviation of the on-voltage ΔVon may be reduced. The carrier peak concentration $C_{ppk}$ of the p⁺-type collector layer 9 when the switching speed is to be increased, for example, is about $10^{15}$/cm³ to less than $10^{18}$/cm³ (preferably, $0.5 \times 10^{17}$/cm³ or less).

In particular, the carrier peak concentration $C_{ppk}$ of the p⁺-type collector layer 9 may be, for example, about 5 the carrier concentration $C_{n1a}$ at the interface 12a of the first n-type layer 10a and the p⁺-type collector layer 9 or greater ($C_{ppk}/C_{n1a} \geq 5$), and more desirably, for example, may be about 10 times or greater ($C_{ppk}/C_{n1a} \geq 10$). By setting the concentration ratio $C_{pn2}$ of the carrier peak concentration $C_{ppk}$ of the p⁺-type collector layer 9 to the carrier concentration $C_{n1a}$ at the interface 12a of the first n-type layer 10a and p⁺-type collector layer 9 in this manner, as depicted in FIG. 4, the deviation of the on-voltage ΔVon, for example, may be suppressed to about 5% or less. An upper limit of the concentration ratio $C_{pn2}$ of the carrier peak concentration $C_{ppk}$ of the p⁺-type collector layer 9 to the carrier concentration $C_{n1a}$ at the interface 12a of the first n-type layer 10a and the p⁺-type collector layer 9, for example, may be determined with consideration of switching speed as described above.

The carrier concentration $C_{n1a}$ at the interface 12a of the first n-type layer 10a and the p⁺-type collector layer 9 may be reduced to about the impurity concentration (i.e., the carrier concentration $C_{n5}$ of the n⁻-type drift layer 1) of a bulk substrate. The bulk substrate is a bulk, single-crystalline silicon substrate grown by a general crystal growth method such as a Czochralski method or a float zone method. In other words, the carrier concentration $C_{n1a}$ at the interface 12a of the first n-type layer 10a and p⁺-type collector layer 9 may be lower than the carrier concentration $C_{n2}$ at the interface 12b of the first n-type layer 10a and the tail portion of the second n-type layer 10b, the carrier concentration $C_{n3}$ at the interface 12c of the second n-type layer 10b and the tail portion of the third n-type layer 10c, and the carrier concentration $C_{n4}$ at the interface 12d of the third n-type layer 10c and the tail portion of the fourth n-type layer 10d.

Figure 5:
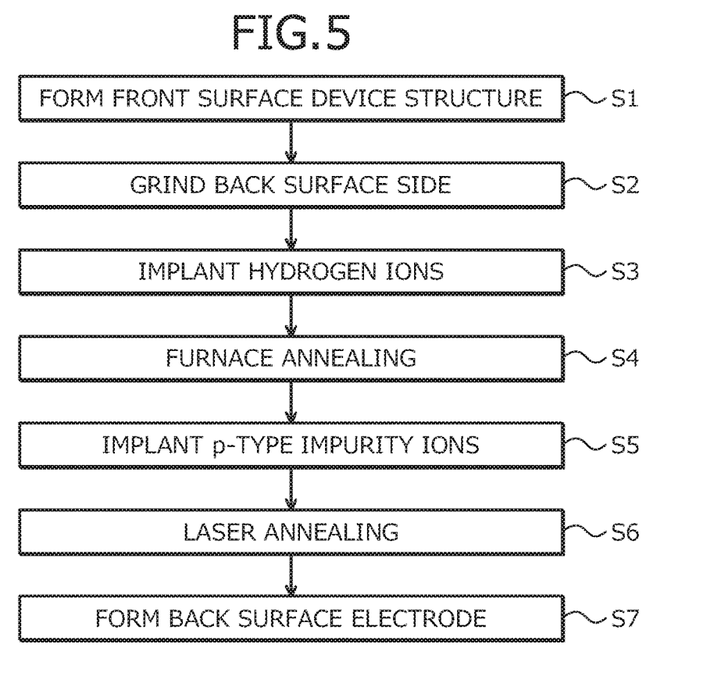
FIG. 5 is a flowchart depicting an outline of the method of manufacturing a semiconductor device according to the present embodiment.

A method of manufacturing a semiconductor device according to the present embodiment will be described. FIG. 5 is a flowchart depicting an outline of the method of manufacturing a semiconductor device according to the present embodiment. A front surface device structure configured by the MOS gate structure, the interlayer insulating film 7, the emitter electrode 8, an edge termination structure (not depicted), and a passivation film (not depicted), etc. are formed by a general method on a front surface side of an n⁻-type semiconductor substrate (semiconductor wafer) forming the n⁻-type drift layer 1 (step S1). Next, the n⁻-type semiconductor substrate is ground from the back surface side to a position of a product thickness for use as a semiconductor device (step S2).

Next, the n-type field stop layer 10 in the n⁻-type drift layer 1 is formed by ion implanting hydrogen from the back surface side of the n⁻-type semiconductor substrate (step S3). In the present embodiment, a first implantation process according to the present invention is realized by the process at step S3. At step S3, hydrogen ion implantation is performed multiple times with differing accelerating voltages so as to form the first to fourth n-type layers 10a to 10d for which the peak positions 20a to 20d of the carrier peak concentrations $C_{npk1}$ to $C_{npk4}$ are the positions of the implantation depth (i.e., range Rp of the hydrogen ion implantation) of each hydrogen ion implantation. The implantation depth of hydrogen ion implantation is deeper than a penetration depth of a laser irradiated from the substrate back surface at a laser annealing process for activating the p⁺-type collector layer 9 described hereinafter.

In particular, the hydrogen ion implantation at step S3, for example, may be proton implantation (proton irradiation). A layer of defects (vacancies (V)) is formed by the proton irradiation, at a predetermined depth from the back surface of the n⁻-type semiconductor substrate forming the n⁻-type drift layer 1. Hydrogen atoms irradiated on the defects and oxygen (O) atoms in the n⁻-type semiconductor substrate bond, producing complex defects (VOH defects). The VOH defects act as donors (hydrogen donors) supplying electrons, whereby the layer of VOH defects functions as the n-type field stop layer 10.

Furnace annealing (first heat treatment) for increasing the VOH defect density and increasing the hydrogen donor concentration (VOH defect concentration) is performed (step S4). In the present embodiment, a first heat treatment process according to the present invention is realized by the process at step S4. By the furnace annealing at step S4, hydrogen donor generation advances, forming in the n⁻-type drift layer 1, a donor layer having the carrier peak concentrations $C_{npk1}$ to $C_{npk4}$, which are higher than the carrier concentration $C_{n5}$ of the n⁻-type semiconductor substrate. The donor layer is the first to fourth n-type layers 10a to 10d.

Further, by hydrogen ion implantation and furnace annealing at the steps S3 and S4, a hydrogen transmission region (not depicted) having a hydrogen concentration that is equal to or greater than a hydrogen concentration of the n⁻-type semiconductor substrate (bulk substrate) before the hydrogen ion implantation, i.e., before being subject to the manufacturing process, is formed in a region (the collector side) shallower than the n-type field stop layer 10 from the substrate back surface. This hydrogen transmission region may be a donor region.

By the processes thus far, the carrier concentration distribution of the first to fourth n-type layers 10a to 10d come to have the carrier concentration distribution of the state without laser annealing in FIGS. 2 and 3. In other words, the tail portion 33 is formed in all of the first to fourth n-type layers 10a to 10d. The carrier concentration $C_{n1b}$ at the interface 12f of the p⁺-type collector layer 9 and the tail portion 33 of the first n-type layer 10a is higher than the carrier concentrations $C_{n2}$ to $C_{n4}$ at the interfaces 12b to 12d of the tail portions of the second to fourth n-type layers 10b to 10d and the first to third n-type layers 10a to 10c adjacent to the tail portions of the second to fourth n-type layers 10b to 10d on the collector side, respectively ($C_{n1b}>C_{n2}>C_{n3}>C_{n4}$).

Next, from the back surface side of the n⁻-type semiconductor substrate after grinding, for example, a p-type impurity such as boron is ion implanted (hereinafter, p-type impurity ion implantation), whereby the p⁺-type collector layer 9 of the surface layer of the back surface of the n⁻-type semiconductor substrate is formed at a position shallower than the n-type field stop layer 10 (step S5). In particular, the p⁺-type collector layer 9 is formed in the hydrogen transmission region of the substrate back surface. In the present embodiment, a second implantation process according to the present invention is realized by the process at step S5.

Next, laser of a predetermined penetration depth is irradiated from the back surface of the n⁻-type semiconductor substrate and laser annealing (second heat treatment) is performed (step S6). The p⁺-type collector layer 9 is activated and the carrier concentration $C_{n1b}$ is a vicinity of the interface 12f of the p⁺-type collector layer 9 and the tail portion 33 of the first n-type layer 10a is reduced by the laser annealing. In the present embodiment, a second heat treatment process according to the present invention is realized by the process at step S6.

In particular, a portion to a relatively shallow depth from the laser irradiated surface (the substrate back surface), for example, about 2 μm to 3 μm is heated to about 1000 degrees C. or higher (for example, about the melting point of silicon (Si), 1416 degrees C.) and is melted, whereby hydrogen donors (VOH defects) disappear and the carrier concentration at the heated portion decreases. Here, the carrier concentration of a vicinity of the interface 12a of the first n-type layer 10a and the p⁺-type collector layer 9 is reduced so that the concentration ratio $C_{pn2}$ of the carrier peak concentration $C_{ppk}$ of the p⁺-type collector layer 9 to the carrier concentration $C_{n1a}$ at the interface of the p⁺-type collector layer 9 and the first n-type layer 10a after the laser annealing becomes within the above range. As a result, the slope of the carrier concentration distribution of the first n-type layer 10a, at the portion 22 on the collector side from the peak position 20a distribution becomes greater than before the laser annealing (without laser annealing).

In particular, for example, the tail portion 33 of the first n-type layer 10a disappears, and the slope of the carrier concentration distribution of the portion where the tail portion 33 of the first n-type layer 10a disappeared is made greater than that before the laser annealing. The slope of the carrier concentration distribution of the portion where the tail portion 33 of the first n-type layer 10a disappears may be such that the concentration ratio $C_{pn2}$ of the carrier peak concentration $C_{ppk}$ of the p⁺-type collector layer 9 to the carrier concentration $C_{n1a}$ at the interface of the p⁺-type collector layer 9 and the first n-type layer 10a after the laser annealing is within the above range, and may be properly set. For example, the slope of the carrier concentration distribution of the portion where the tail portion 33 of the first n-type layer 10a disappears may be substantially the same as the slope of the carrier concentration distribution of a portion 32 from the peak position 20a to the inflection point 31 in the state before the laser annealing.

At step S6, for example, the laser annealing may be performed under a condition enabling a portion relatively shallow from the laser irradiated surface to be heated at about 500 degrees C. or higher whereby hydrogen donors disappear. Further, the laser annealing is performed for a short period of, for example, about 100 ns, such that hydrogen donors in a portion equal to or deeper than the peak position 20a of the first n-type layer 10a from the laser irradiated surface disappear.

By the processes thus far, the carrier concentration distribution of the first n-type layer 10a come to have the carrier concentration distribution of the state with the laser annealing in FIGS. 2 and 3. The carrier concentration distribution of the second to fourth n-type layers 10b to 10d does not substantially change before and after the laser annealing. Next, the collector electrode 11 contacting the p⁺-type collector layer 9 is formed as a back surface electrode (step S7). Thereafter, semiconductor wafer is diced (cut) into chips, whereby the IGBT depicted in FIG. 1 is completed.

As described, according to the embodiment, since the n-type field stop layer is formed by the hydrogen ion implantation, the hydrogen atoms of the relatively shallow portion of the substrate back surface may be caused to disappear by the laser annealing thereafter and the carrier concentration of the n-type field stop layer may be lowered. As a result, even when the p⁺-type collector layer having a low carrier concentration is formed to increase the switching speed, the carrier concentration of the n-type field stop layer may be reduced by laser annealing after formation of the p⁺-type collector layer. In other words, irrespective of the carrier concentration of the p⁺-type collector layer, the concentration ratio of the carrier peak concentration of the p⁺-type collector layer to the carrier concentration at the interface of the p⁺-type collector layer and the n-type layer farthest on the collector side may be established to be a predetermined value or greater. Therefore, deviation of the on-voltage may be reduced.

In the description, the present invention is not limited to the described embodiment and various modifications are possible without departing from the spirit of the invention. For example, in the embodiment, although a case is described where a n-type field stop layer formed by four n-type layers is disposed, even when the n-type field stop layer is configured by 2, 3, or 5 or more of the n-type layers, the same effects are achieved.

The present invention is further applicable when the n-type field stop layer is formed by one n-type layer and after the hydrogen ion implantation and furnace annealing for forming the n-type field stop layer, the carrier concentration of a relatively shallow portion of the n-type field stop layer, from the substrate back surface is reduced. In the embodiment, although a trench gate-type IGBT is described as an example, the present invention is further applicable to planar gate-type IGBT.

For example, according to a conventional method of manufacturing, a region (proton transmission region) of the substrate back surface side through which protons have passed once consequent to the proton irradiation for forming the n-type field stop layer tends to become a hydrogen donor. Therefore, when proton irradiation of differing accelerating voltages is performed multiple times to form a broad n-type field stop layer, the carrier concentration of the n-type layer nearest to the collector side among the n-type layers configuring the broad n-type field stop layer becomes high. When the carrier concentration of this n-type layer nearest the collector side is high at a vicinity of the interface with the collector layer, the following problem arises when the switching speed of the IGBT is increased.

In other words, in increasing the switching speed of the IGBT, to suppress the injection efficiency of holes from the collector side, the carrier concentration of the $p^+$-type collector layer has to be lowered, however, when the carrier concentration of the $p^+$-type collector layer is lowered, the carrier concentration ratio relative to the n-type layer nearest the collector side decreases, arising in a problem of increased deviation of the on-voltage.

Even when the n-type field stop layer is formed by ion implantation of an n-type impurity such as phosphorus (P) or selenium (Se), the carrier concentration of the n-type field stop layer increases at a vicinity near the collector layer interface and the same problem arises.

However, the semiconductor device and the method of manufacturing a semiconductor device of the present invention achieve an effect in that deviation of the on-voltage may be reduced.

As described, the semiconductor device and the method of manufacturing a semiconductor device according to the present invention are useful in semiconductor devices having an n-type field stop layer and are particularly suitable for IGBTs having an n-type field stop layer disposed at a deep position from the substrate back surface.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a first semiconductor layer of a first conductivity type, a front surface device structure formed on a first principal surface of the first semiconductor layer;
   a plurality of second semiconductor layers of the first conductivity type, formed in the first semiconductor layer at a second principal surface thereof, each having a donor concentration higher than that of the first semiconductor layer, the donor concentration having respective peak values thereof at different depths from the second principal surface of the first semiconductor layer; and
   a third semiconductor layer of a second conductivity type formed in the first semiconductor layer at the second principal surface thereof, a distance between the third semiconductor layer and the first principal surface of the semiconductor layer being larger than a distance between each second semiconductor layer and the first principal surface of the semiconductor layer, wherein
   each second semiconductor layer of the plurality of second semiconductor layers, except for a first second semiconductor layer adjacent to the third semiconductor layer, has a donor concentration distribution in which the donor concentration of said each second semiconductor layer decreases from the peak value thereof toward the third semiconductor layer, to thereby consecutively form a first slope and a second slope connected at a predetermined position, donor concentrations on the second slope being smaller than those on the first slope, and
   a donor or acceptor concentration at a first interface between the first second semiconductor layer and the third semiconductor layer is not larger than a donor concentration at a second interface between the first second semiconductor layer and another one of the second semiconductor layers adjacent to the first second semiconductor layer, the first interface being at a depth position where the donor concentration of the first second semiconductor layer and the acceptor concentration of the third semiconductor layer are substantially the same.

2. The semiconductor device according to claim 1, wherein the donor concentration at the first interface is less than a donor concentration at a third interface between yet another one of the second semiconductor layers closest to the first semiconductor layer and one of the second semiconductor layers adjacent to the yet another one second semiconductor layer.

3. The semiconductor device according to claim 1, wherein a peak value of a acceptor concentration of the third semiconductor layer is at least five times of the acceptor concentration at the first interface.

4. The semiconductor device according to claim 1, wherein the front surface device structure includes:
   a first semiconductor region of the second conductivity type, formed in the first semiconductor layer at the first principal surface thereof, a second semiconductor region of the first semiconductor type, formed in the first semiconductor region, a gate insulating film formed to contact a region of the first semiconductor region between the first semiconductor layer and the second semiconductor region, and a gate electrode formed on an opposite side of the first semiconductor region, to sandwich the gate insulating film with the first semiconductor region.

5. The semiconductor device according to claim 4, further comprising:
   a first electrode contacting the first semiconductor region and the second semiconductor region; and
   a second electrode contacting the second principal surface of the first semiconductor layer.

6. A semiconductor device, comprising:
a first semiconductor layer of a first conductivity type;
a front surface device structure formed on a first principal surface of the first semiconductor layer;
a plurality of second semiconductor layers of the first conductivity type, formed in the first semiconductor layer at a second principal surface thereof, each having a donor concentration higher than that of the first semiconductor layer, the donor concentration having respective peak values thereof at different depths from the second principal surface of the first semiconductor layer; and
a third semiconductor layer of a second conductivity type formed in the first semiconductor layer at the second principal surface thereof, a distance between the third semiconductor layer and the first principal surface of the semiconductor layer being larger than a distance between each second semiconductor layer and the first principal surface of the semiconductor layer, wherein
each second semiconductor layer of the plurality of second semiconductor layers, except for a first second semiconductor layer adjacent to the third semiconductor layer, has a donor concentration distribution in which the donor concentration of said each second semiconductor layer decreases from the peak value thereof toward the third semiconductor layer, to thereby consecutively form a first slope and a second slope connected at a predetermined position, donor concentrations on the second slope being smaller than those on the first slope, and
a donor or acceptor concentration at an interface between the first second semiconductor layer and the third semiconductor layer is no smaller than the donor concentration of the first semiconductor layer, and is no larger than a donor concentration at another interface between the first second semiconductor layer and another one of the second semiconductor layers adjacent to the first second semiconductor layer, said interface between the first second semiconductor layer and the third semiconductor layer being at a depth position where the donor concentration of the first second semiconductor layer and the acceptor concentration of the third semiconductor layer are substantially the same.

7. The semiconductor device according to claim 6, wherein a peak value of a acceptor concentration of the third semiconductor layer is at least five times of the acceptor concentration at the interface between the first second semiconductor layer and the third semiconductor layer.

8. The semiconductor device according to claim 6, wherein the front surface device structure further includes:
a first semiconductor region of the second conductivity type, formed in the first semiconductor layer at the first principal surface thereof, a second semiconductor region of the first semiconductor type, formed in the first semiconductor region, a gate insulating film formed to contact a region of the first semiconductor region, between the first semiconductor layer and the second semiconductor region, and a gate electrode formed on an opposite side of the first semiconductor region, to sandwich the gate insulating film with the first semiconductor region.

9. The semiconductor device according to claim 8, further comprising:
a first electrode contacting the first semiconductor region and the second semiconductor region; and
a second electrode contacting the second principal surface of the first semiconductor layer.

* * * * *